United States Patent
Dey et al.

(10) Patent No.: US 12,243,193 B2
(45) Date of Patent: Mar. 4, 2025

(54) METHOD FOR DE-NOISING AN ELECTRON MICROSCOPE IMAGE

(71) Applicant: IMEC VZW, Leuven (BE)

(72) Inventors: Bappaditya Dey, Heverlee (BE); Sandip Halder, Bierbeek (BE); Gouri Sankar Kar, Leuven (BE); Victor M. Blanco, Leefdaal (BE); Senthil Srinivasan Shanmugam Vadakupudhu Palayam, Blanden (BE)

(73) Assignee: IMEC VZW, Leuven (BE)

( * ) Notice: Subject to any disclaimer, the term of this patent is extended or adjusted under 35 U.S.C. 154(b) by 260 days.

(21) Appl. No.: 17/366,350

(22) Filed: Jul. 2, 2021

(65) Prior Publication Data
US 2022/0076383 A1  Mar. 10, 2022

(30) Foreign Application Priority Data
Sep. 10, 2020 (EP) .................................. 20195447

(51) Int. Cl.
*G06T 5/70* (2024.01)
*G06T 5/50* (2006.01)

(52) U.S. Cl.
CPC ...... *G06T 5/70* (2024.01); *G06T 2207/10061* (2013.01); *G06T 2207/20081* (2013.01); *G06T 2207/20084* (2013.01)

(58) Field of Classification Search
CPC .......... G06T 5/002; G06T 2207/10061; G06T 2207/20081; G06T 2207/30148; G06T 5/50; G06T 7/0002
See application file for complete search history.

(56) References Cited

U.S. PATENT DOCUMENTS 10,276,346 B1 *  4/2019  Duffy ............. H01J 37/28
2012/0053723 A1   3/2012  Richter
(Continued)

FOREIGN PATENT DOCUMENTS

| CN | 107909558 A | 4/2018 |
| CN | 110517195 A | 11/2019 |
| WO | 2020/003458 A1 | 1/2020 |

OTHER PUBLICATIONS

Krull, Alexander, Tim-Oliver Buchholz, and Florian Jug. "Noise2void-learning denoising from single noisy images." In Proceedings of the IEEE/CVF Conference on Computer Vision and Pattern Recognition, 9 pages. 2019. (Year: 2019).*

(Continued)

*Primary Examiner* — Nancy Bitar
*Assistant Examiner* — Dustin Bilodeau
(74) *Attorney, Agent, or Firm* — McDonnell Boehnen Hulbert & Berghoff LLP

(57) ABSTRACT

The disclosure relates generally to image processing. For example, the invention relates to a method and a device for de-noising an electron microscope (EM) image. The method includes the act of selecting a patch of the EM image, wherein the patch comprises a plurality of pixels, wherein the following acts are performed on the patch: i) replacing the value of one pixel, for example of a center pixel, of the patch with the value of a different, for example randomly selected, pixel from the same EM image; ii) determining a de-noised value for the one pixel based on the values of the other pixels in the patch; and iii) replacing the value of the one pixel with the determined de-noised value.

19 Claims, 9 Drawing Sheets

(56) References Cited

U.S. PATENT DOCUMENTS

| | | |
|---|---|---|
| 2019/0333199 A1 | 10/2019 | Ozcan et al. |
| 2019/0347781 A1 | 11/2019 | Huang et al. |
| 2020/0001894 A1 | 1/2020 | Kaneko et al. |
| 2020/0242739 A1* | 7/2020 | Laine .................... G06N 3/088 |
| 2021/0027455 A1* | 1/2021 | Kimizuka ............. G06T 7/0004 |
| 2021/0270891 A1* | 9/2021 | Komori .............. G01R 31/2868 |

OTHER PUBLICATIONS

Extended European Search Report and Written Opinion, Application No. EP20195447.6, dated May 28, 2021, 12 pages.
Partial European Search Report, Application No. EP20195447.6, dated Feb. 23, 2021, 12 pages.
Krull, Alexander, Tim-Oliver Buchholz, and Florian Jug. "Noise2void-learning denoising from single noisy images." In Proceedings of the IEEE/CVF Conference on Computer Vision and Pattern Recognition, 9 pages. 2019.
Goncharova, Anna S., Alf Honigmann, Florian Jug, and Alexander Krull. "Improving blind spot denoising for microscopy." In European Conference on Computer Vision, 15 pages. Springer, Cham, 2020.
Ronneberger O., Fischer P., Brox T. (2015) U-Net: Convolutional Networks for Biomedical Image Segmentation. In: Navab N., Hornegger J., Wells W., Frangi A. (eds) Medical Image Computing and Computer-Assisted Intervention—MICCAI 2015. MICCAI 2015. Lecture Notes in Computer Science, vol. 9351, pp. 234-241, Springer, Cham.

\* cited by examiner

METHOD FOR DE-NOISING AN ELECTRON MICROSCOPE IMAGE

CROSS-REFERENCE TO RELATED APPLICATIONS

The present application is a non-provisional patent application claiming priority to European Patent Application No. 20195447.6, filed on Sep. 10, 2020, the contents of which are hereby incorporated by reference.

FIELD OF THE DISCLOSURE

The present disclosure relates generally to image processing, and specifically to a method and a device for de-noising an electron microscope (EM) image. The present disclosure further relates to a method for analyzing a sample.

BACKGROUND

Scanning electron microscopes (SEM) are widely used imaging tools for the semiconductor industry. SEMs are, for example, used to measure critical dimensions (CD) and roughness features of resist patterns.

The electrical characteristics of an electronic circuit formed by lithographic patterning techniques are significantly influenced by features such as line-edge roughness (LER) and line-width roughness (LWR). It is, therefore, important to analyze these features. However, CD-SEM images typically contain a significant level of noise and, thus, accurate measurements of LER/LWR and CD of SEM images are a substantial challenge. In particular, conventional image processing techniques and noise-filtering methods often smooth away such edge information. In addition, the quantification of noise in CD-SEM images is difficult, because the noise of an image often depends on metrology settings and sample properties and does not fit truly Gaussian or Poisson distributions.

Recent discriminative deep learning-based algorithms have outperformed conventional noise filtering methods. However, these machine learning methods generally require clean ground-truth images for training purposes which, in many cases, either do not exist, or are difficult to acquire.

Alternatively, some known deep learning approaches are based on generating synthetic noiseless images from software-tools and using them for supervised learning or on degrading clean target images with approximated noise levels and using them for semi-supervised learning. Often these methods require additional conditional files to generate those corresponding synthetic images which may lead to additional artefacts and, thus, affect the accuracy of measured metrics such as LER/LWR and CD.

SUMMARY

According to a first aspect, the present disclosure relates to a method for de-noising an electron microscope (EM) image, comprising the act of: selecting a patch of the EM image, wherein the patch comprises a plurality of pixels, wherein the following acts are performed on the patch:
  replacing the value of one pixel, for example of a center pixel, of the patch with the value of a different, for example randomly selected, pixel from the same EM image;
  determining a de-noised value for the one pixel based on the values of the other pixels in the patch; and
  replacing the value of the one pixel with the determined de-noised value.

In some examples, the SEM image can efficiently be de-noised, for example without requiring additional ground truth or synthetic images.

Furthermore, by replacing the value of the selected pixel with another, for example randomly selected, pixel value from anywhere in the image, a blind spot in the location of the selected pixel is created. This blind spot prevents a neural network that carries out the method from simply learning the identity of the selected pixel.

The masking/blind-spot mechanism of the method can guarantee the inability of the model to learn an identity mapping from input to output and vice-versa. This allows the architecture to be deployed as "unsupervised model" where a single noisy image is used as input and target.

For example, the blind-spot/masked image patch is used as input image/patch and the actual noisy image/patch is used as target patch. Therefore, it is not needed to have a clean target image and two or more noisy images as required for training in other machine learning models. This is especially advantageous when working with SEM images, because it may not be possible to scan to capture a SEM image of a specific device structure more than once at the same conditions, because the scanning electrons generally damage the resist profile as well as the substrate underneath in each scan. Thus, when making SEM images, generally only one image with the same imaging conditions can be captured for each location. At the same time, the method can save time, cost, and man-power to collect many noisy images.

For example, it is assumed that the noise is pixel-wise independent given the signal. Therefore, the neighboring pixels carry no information about the value of the one noisy pixel. The best expected value for the noise is zero. The actual value of the pixel, however, is statistically dependent on its surrounding neighboring pixels. Therefore, the model can predict/estimate the value of the one pixel from the values of its surrounding pixels and/or from the overall pixels in the image.

In other words: the method may predict the actual signal component of a pixel while intentionally restricting itself to make a guess for the random noise value of that pixel. As the noise for any given pixel is random, the model can predict the actual signal component from the surrounding pixel values (signal value component), but cannot make a correct guess for the exact noise component appropriate to the actual signal. Therefore, the model will estimate the noise component to be zero. Thus, the method can determine a noiseless value for the signal of the pixel.

For example, if the signal value is $x=s+n$, with s being the true signal value and n being the noise component, the model can predict either an exact or a slight deviation of the true signal value (s'), and will always predict the noise component (n) to be zero (e.g., what is determined is: $x=s/s'$ with $n=0$).

For example, when determining the de-noised value for the one pixel based on the values of the other pixels in the patch (act ii), the blind-spot image is used as input and the original noisy image as target.

For example, the pixel within the patch that is de-noised is a center or an edge pixel of the patch. The patch can be of any size, depending on the model performance and/or the original image. For example, the patch has a size of 32×32, 64×64, or 128×128 pixels.

For example, the de-noising method is a machine learning method, (e.g., a deep learning method), that is at least partially carried out by a neural network.

For example, the acts i) to iii) are repeated until each noisy pixel within the patch is replaced by a de-noised value.

In an embodiment, the method further comprises the acts of selecting a further patch of the EM image, wherein the further patch comprises a plurality of pixels; and wherein the further patch is different from a previously selected patch of the EM image, and repeating the acts i) to iii) for the selected further patch. In this way, the entire EM image can be de-noised.

In an embodiment, the further patch partially overlaps with a previously selected patch or is adjacent to the previously selected patch. As such, the true de-noised value of the pixel can be predicted and respectively validated against all possible values.

For example, if there are 100 possibilities for a true de-noised pixel value, at each iteration a random value out of 100 is first predicted, and secondly it is determined how realistic the previous guess is based on its surroundings and best case respective to the entire image body.

For example, the de-noising model generally receives noisy patches at an input side and predicts de-noised pixels for the corresponding noisy patch at an output side. For each patch, this procedure is iterated to cover the entire noisy image. Thereby, the following acts can be carried out: a) receiving an image (e.g., of a large size e.g., 2048×2048 pixels; b) extracting small size patches of size 64×64, out of the 2048×2048 image, e.g. dividing the 2048×2048 pixels into 1024 noisy patches with a size of 64×64 each; c) starting to de-noise each and every patch with a sliding kernel size of 3×3, i.e. a 3×3 kernel is sliding each time 1 pixel [left, right, up, down] to cover each pixel of the 64×64 patch; d) after training and validation, generating de-noised image patches; e) stitching all de-noised patches to a finally de-noised image at the output; and f) iterating randomly the above acts b)-e) a few times.

For example, the number of patches for an EM image is fixed. The patches can be extracted in an initial act. For any random patch a kernel of size n×n, n=3, 5, 7, . . . etc. can be chosen. For instance, the kernel has a size of 3×3. This kernel can then be shifted step by step, e.g. by one pixel each time if a stride parameter is 1. In other words, on each selected patch, the kernel is moving over the entire patch step-by-step to de-noise the pixels in the patch. By subsequently moving the kernel over the different random patches, the entire image can be de-noised in this way.

In an embodiment, the acts of selecting a further patch and repeating the acts i) to iii) for the respective selected further patch are repeated until all pixels of the EM image are replaced by a respective de-noised value.

For example, the de-noising of the EM image can be repeated in several iterations until all noisy pixels are replaced by a de-noised value.

In an embodiment, the method comprises the further act of determining a noise level of the EM image based on the differences between the original pixel values of the EM image and the determined de-noised values. As such, information on an inherent noise level of the individual EM tool that was used to record the EM image can be acquired. For example, this information can be used to analyze and compare different EM tools, e.g., to identify and map differences of their E-beam columns.

For example, the noise level is a measure of the amount of noise in the EM image. If the average difference between the original pixel value and the de-noised pixel value is large, e.g. exceeds a certain threshold, a large noise level for the EM image can be determined. For example, if a noisy pixel value is 167 in a gray scale range 0-255, the de-noised value of the same pixel is less than 167, e.g. 135. Therefore, the noise component is 167−135=32. So, when averaging in the range, any value greater than an average threshold value is regarded as noise-level for any tool.

In an embodiment, the de-noised value of the one pixel is at least partially determined based on assumed statistical dependencies between the noiseless components of the pixel values of the other pixels in the patch and on an assumed statistical independence between the noise components of the pixel values of neighboring pixels.

For example, due to the statistical dependencies, a neural network that carries out the method can estimate the signal of the pixel based on the neighboring pixels within the patch, while at the same time these neighboring pixels carry no information on the noise value of the one pixel.

In an embodiment, at least the act of determining the de-noised value for the one pixel of the patch is carried out by a trainable neural network, for example a U-Net based neural network.

The trainable neural network can be a generative adversarial network (GAN). The trainable neural network can employ a deep learning model to de-noise the noise level from the true signal of each pixel of the EM image.

For example, the U-Net is a derived architecture from a basic convolutional neural network (mainly used for any image classification task). The U-Net can be used not only to classify an image to a particular target class (like Cat/Dog) but also to localize an object in an image. Thereby, the U-Net is able to perform classification on every pixel and input and output share the same size.

A U-Net architecture is, for example, shown in: Ronneberger O., Fischer P., Brox T. (2015) U-Net: Convolutional Networks for Biomedical Image Segmentation. In: Navab N., Hornegger J., Wells W., Frangi A. (eds) Medical Image Computing and Computer-Assisted Intervention—MICCAI 2015. MICCAI 2015. Lecture Notes in Computer Science, vol 9351, pages 234-241, Springer, Cham.

For example, the U-Net has a symmetric architecture and consists of two parts: the left part is called "contracting" and right part is called "expanding". The aim of the "contracting" path is to generate an increased number of features (depth of image). This process is repeated three more times (each act involves two convolution layers, max-pooling and then optional drop-out mechanism to optimize overfitting). Lastly, two more convolutional layers are employed without max-pooling. The aim of "expanding" is to up-sample or increase each subsampled patch which was obtained in each "contracting path" act. This helps to get a more precise prediction. In this way, in a last act, the actual image sized de-noised image is retrieved.

In summary, each noisy image can be sub-sampled into multiple patches first. Training can be performed with these patch-sized images with a target pixel each time, to de-noise first and then after de-noising predicting the actual signal value looking at all neighboring pixels. Lastly the patches can be stitched together to retrieve a de-noised version of the noisy image.

For example, during training random (64×64) and (32×32) pixel patches can be drawn from a training dataset. A blind-spot mechanism can be applied on each image patch and the U-Net model can be trained with (input-patch as blind-spot masked image, target-patch as original noisy patch before masking) image-pairs as any conventional CNN training scheme.

In an embodiment, the trainable neural network is trained by an unsupervised learning algorithm each time it determines a de-noised value for a pixel of a patch of the EM image. As such, the neural network can be trained without requiring additional ground truth or synthetic images.

For example, the trainable neural network can be configured to employ an unsupervised Gaussian-Mixture-Model (unsupervised GMM) to train the trainable neural network and/or to de-noise the pixels of the EM image at the same time. For example, the unsupervised GMM can detect edges in the EM image (image/feature segmentation).

In an embodiment, the trainable neural network is configured to apply a kernel to the pixels of the patch to determine the de-noised value of the one pixel.

According to a second aspect, the present disclosure relates to a device for de-noising an EM image, comprising a receiving unit configured to receive an EM image; and a data processing unit configured to perform the de-noising method according to the first aspect of the disclosure on the received EM image.

The data processing unit may comprise a processor and/or the trainable neural network for carrying out the method according to the first aspect of the disclosure.

The above description with regard to the de-noising method according to the first aspect of the disclosure is correspondingly valid for the device according to the second aspect of the disclosure.

According to a third aspect, the present disclosure relates to a method for analyzing a sample, for example a die comprising memory structures, wherein the method comprises the acts of:
  recording an electron microscope (EM) image of a section of the sample with a scanning electron microscope (SEM) wherein the EM image is recorded in a voltage contrast mode of the SEM;
  de-noising the recorded EM image according to the method of the first aspect of the disclosure;
  performing a spatially resolved inspection measurement of the section of the sample, wherein the inspection measurement comprises determining electrical property values, for example conductivity values, at different locations of the section of the sample;
  correlating the pixel values of the de-noised EM image to the electrical property values determined at the different locations of the section of the sample; and
  generating a property map based the correlation, wherein the property map indicates the electrical properties of structures visible in the EM image.

As such, the sample can be analyzed based on a de-noised SEM image. For example, a representation of the sample can be provided in the form of the property map that can allow for quickly and easily determining the electrical properties of the sample.

For example, in the act of de-noising the recorded EM image, at least the acts (i)-(iii) of the method for de-noising an EM image according to the first aspect of the disclosure are carried out.

The de-noising the recorded EM image can be carried out by a trained neural network, for example a U-Net based neural network. The trained neural network can be trained by performing the de-noising method according to the first aspect of the disclosure. The trained neural network can be a GAN or CNN.

For example, the spatially resolved inspection measurement can be carried out by an electrical probe station fitted with an impedance analyzer.

In an embodiment, the method further comprises the act of determining a calibration curve based on the correlation, wherein the calibration curve correlates pixel values of the EM image to electrical property values. As such, further property maps for further EM images can be generated based on the calibration curve.

For example, the calibration curve is generated in the form of a lookup table, which comprises a list of electrical property values, e.g. resistivity values, for respective pixel values of an EM image, for example gray level values. For instance, one electrical value each is assigned to a gray value in the lookup table. The lookup table can be stored in a memory and can be updated each time a measurement according to the analysis method above is carried out.

In an embodiment, the method further comprises the acts of recording a further EM image of a section of the same sample or of a section of a different sample with the SEM in the voltage contrast mode; and generating a further property map based on the further EM image and the calibration curve, wherein the further property map indicates the electrical property of structures visible in the further EM image. As such, property maps can be generated based on the calibration curve.

In an embodiment, the act of determining the calibration curve is carried out by a trainable neural network, for example, a multilayer perceptron (MLP) neural network.

For example, the MLP neural network is used to predict mapping outputs of the calibration curve. This has the advantage that fewer electrical inspection results, e.g. resistivity values, from previous experiments are required to generate the calibration curve.

In an embodiment, the method further comprises the acts of generating a synthetic EM image of the section of the sample based on information on the sample, such as lithographic mask data, comparing the synthetic EM image to the de-noised recorded EM image; and identifying defects in the section of the sample based on the comparison. This achieves the advantage that defects on the sample can efficiently be identified.

For example, by comparing the synthetic EM image to the de-noised EM image, the location of defects on the probe can be determined.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
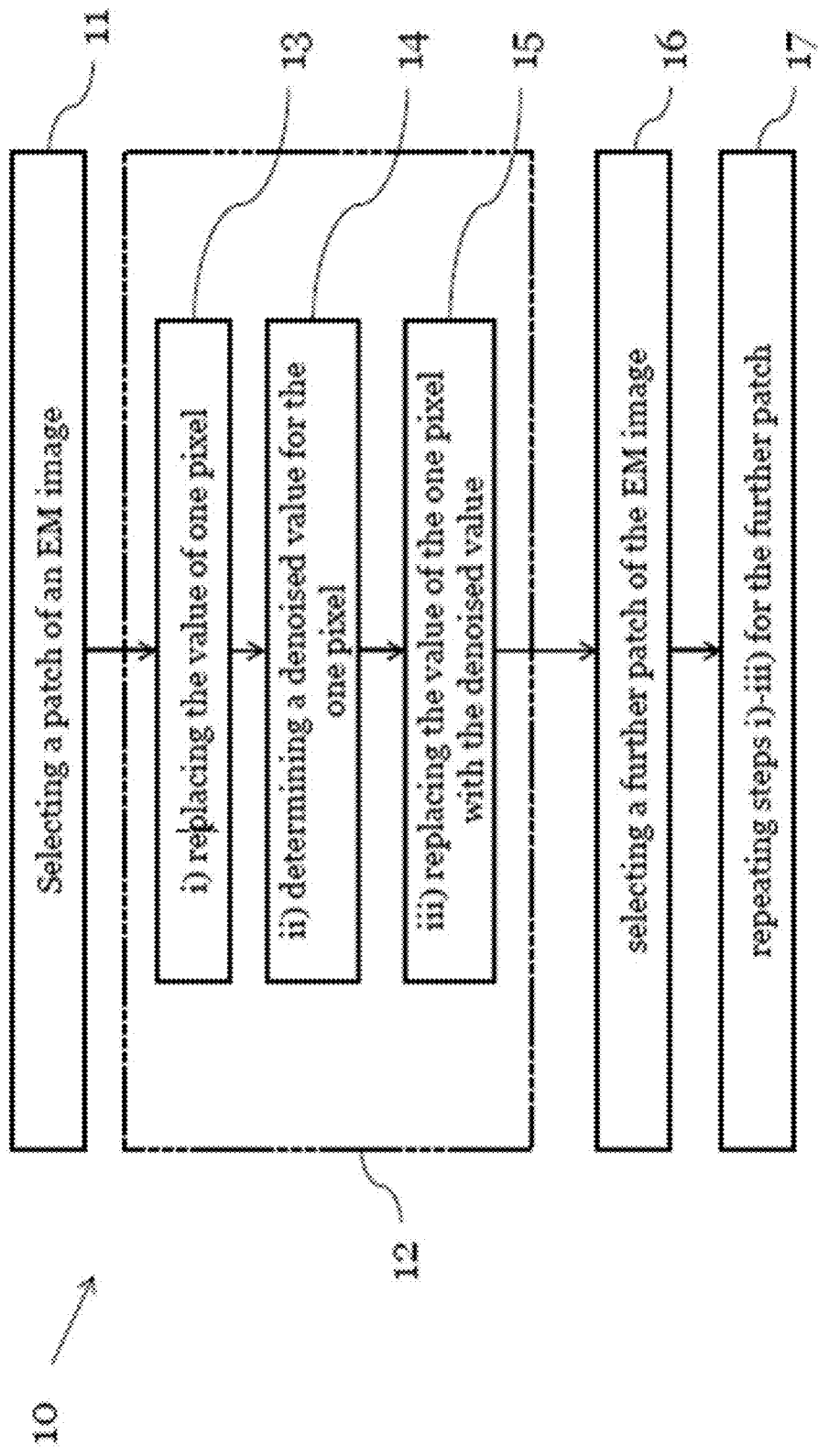
FIG. 1 is a block diagram of a method for de-noising an electron microscope image, according to an example.

FIG. 1 shows acts of a method for de-noising an electron microscope (EM) image.

The method 10 comprises the acts of: selecting 11 a patch of the EM image, wherein the patch comprises a plurality of pixels. Subsequently, the following acts i)-iii) are performed on the patch:

i) replacing 13 the value of one pixel, for example a center pixel, of the patch with the value of a different, for example randomly selected, pixel from the same EM image;

ii) determining 14 a de-noised value for the one pixel based on the values of the other pixels in the patch; and iii) replacing 15 the value of the one pixel with the determined de-noised value.

For example, the acts i-iii) form a de-noising act 12 for the one pixel in the patch.

For example, the acts i) to iii) can be repeated for the pixels in the selected patch until each noisy pixel within the patch is replaced by a de-noised value.

For example, the method comprises the further acts of: selecting 16 a further patch of the EM image, wherein the further patch comprises a plurality of pixels; and wherein the further patch is different from a previously selected patch of the EM image, and repeating 17 the acts i) to iii) for the selected further patch, i.e. de-noising 12 one pixel in the further patch by replacing its value with the value of a different, for example randomly selected, pixel from the same EM image; determining a de-noised value for the one pixel in the further patch based on the values of the other pixels in the further patch; and replacing the value of the one pixel in the further patch with the determined de-noised value.

For example, the de-noising method 10 is a machine learning method, for example a deep learning method, that is carried out by a trainable neural network. By replacing the value of the selected pixel with another, for example randomly selected, pixel value from anywhere in the image, a blind spot in the location of the selected pixel is created. This blind spot prevents a neural network that carries out the method 10 from simply learning the identity of the selected pixel.

For example, the further patch partially overlaps with a previously selected patch or is adjacent to the previously selected patch. In this way, the patch can be moved over the noisy image such that the image is de-noised in a step by step manner.

Overlapping a new patch with a previously selected patch can cause the true de-noised value of the selected pixel to be predicted and respectively validated against all possible values.

For example, the noise of a pixel can be a random fluctuation pixel value. De-noising a pixel may refer to at least partially removing the random fluctuation from the pixel value. For example, the de-noised pixel has value that is closer to its noiseless value, i.e. the real pixel value without the noise component.

The acts of selecting 16 a further patch and de-noising 12 one pixel in each respective further patch can be repeated until the entire EM image is de-noised, i.e. until every pixel in the EM image is de-noised at least once. For example, the de-noising of an EM image according to the method 10 can be repeated in several iterations to correctly replace all corrupted noisy pixels with a de-noised signal. With this method 10, the entire EM image can be de-noised without requiring a clean reference image, e.g. a ground-truth or a synthetic target image. In other words, the same noisy EM image can be used as input and reference image for the de-noising.

For example, the method 10, for example the de-noising 12, is carried out by a trainable neural network, for example a U-Net based neural network. Thereby, the neural network can be configured to apply a kernel, e.g. a convolution matrix, to the pixels of the patch to facilitate determining the de-noised value of the one pixel.

The trainable neural network can be a generative adversarial network (GAN). The trainable neural network can employ a deep learning model to de-noise each pixel of the EM image. Alternatively, the trainable neural network can be a convolutional neural network (CNN).

For example, the trainable neural network is trained by an unsupervised learning algorithm each time it determines a de-noised value for a pixel of a patch of the EM image. For example, the trainable neural network can be configured to employ an unsupervised Gaussian-Mixture-Model (unsupervised GMM). For example, the unsupervised GMM can detect edges in the EM image (image/feature segmentation).

The de-noised value of a target pixel in a patch can at least partially be determined based on assumed statistical dependencies between the noiseless components of the pixel values of the other pixels in the patch and on an assumed statistical independence between the noise components of the pixel values of neighboring pixels.

Optionally, the method 10 can further comprise the acts of: determining a noise level of the EM image based on the differences between the original pixel values of the EM image and the determined de-noised values.

This information can be used to analyze and compare different EM tools, e.g. to identify and map the difference of their E-beam columns. For example, the noise level from EM images, e.g. CD-SEM images, extracted from different tools for similar and/or different settings can be extracted to perform a qualitative and comparative analysis in order to label different CD-SEM tools according to their noise levels.

Figure 2:
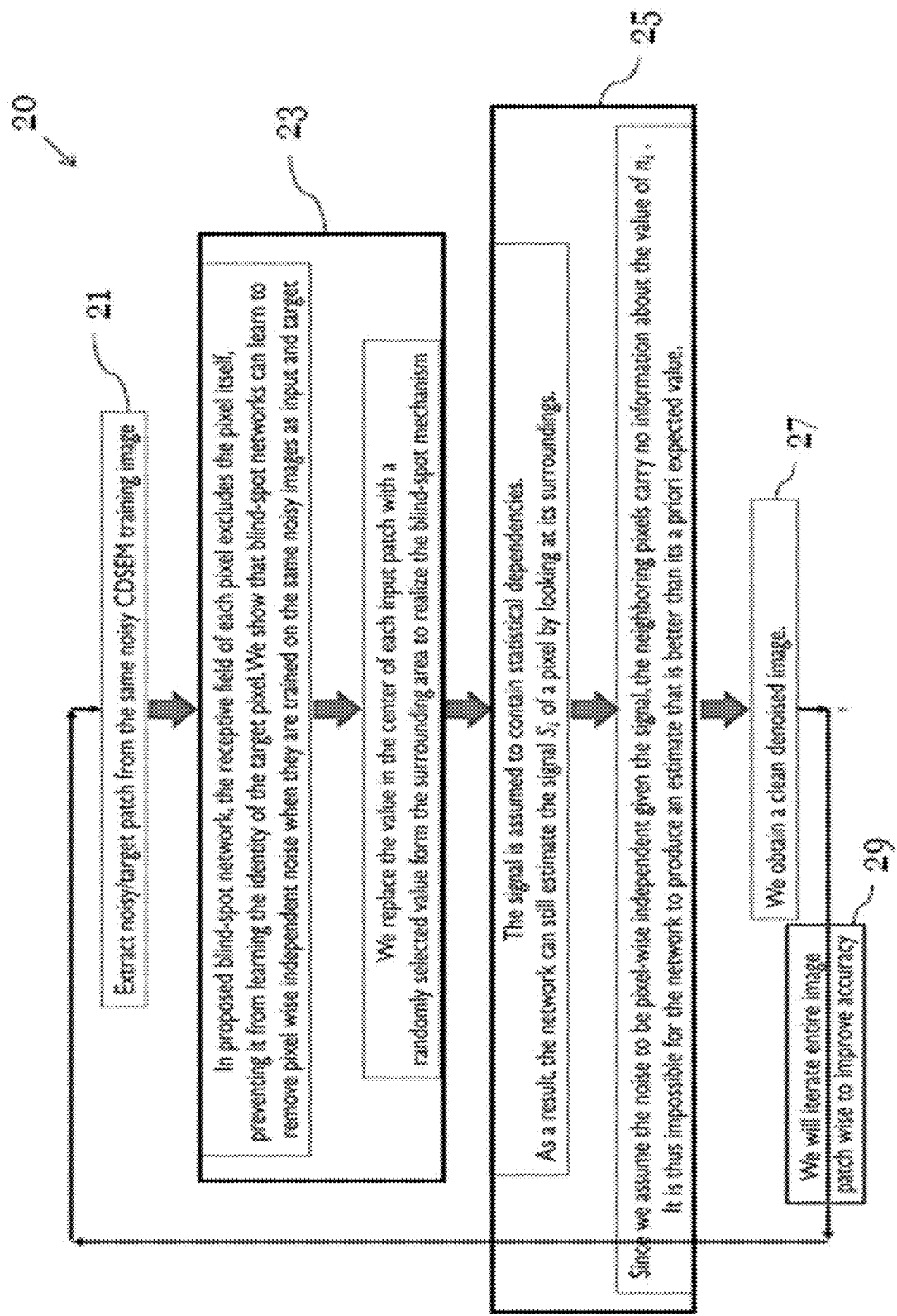
FIG. 2 is a block diagram of a method for de-noising an electron microscope image, according to an example.

FIG. 2 shows acts of a method 20 for de-noising an electron microscope image according to an embodiment. For example, the method 20 shown in FIG. 2 is based on the more general de-noising method 10 shown in FIG. 1.

In a first act 21 of the method 20 a noisy patch comprising a plurality of pixels is extracted from an EM image. The EM image was for instance generated by a critical dimension scanning electron microscope (CD-SEM).

In a second act 23 of the method 20, the value of a center pixel of the patch is replaced by a randomly selected value from anywhere else in the image. This generates a blind spot in the location of the center pixel. Due to this blind spot, the receptive field of the center pixel, e.g. pixels within a radius around the pixel, excludes the pixel itself.

For example, the value of each pixel in the EM image can be expressed by x=s+n, wherein s is the noiseless component of the pixel value and n is the noise component. The EM image can be expressed by a joint probability distribution according to:

$$p(s,n)=p(s)p(n|s),$$

while satisfying the condition $p(s_i, s_j) \neq p(s_i)$ for 2 pixels i, j within a receptive field (RF).

In a third act 25 of the method 20, a noiseless value for the center pixel is estimated based on the surrounding pixels in the patch. For example, the noiseless signal component $s_i$ of the pixels in the patch comprise statistical dependencies from each other. At the same time, the neighboring pixels in the patch carry no information about the noise component $n_i$ of the center pixel. This can be expressed by the flowing equation:

$$p(n,s)=\Pi_i p(n_i, s_i)$$

Therefore, the mean value of the pixel value $x_i$ based on multiple images is:

$$E[x_i]+E[n_i]=s_i+0$$

which corresponds to a clean ground truth image (GT), i.e. a noiseless image. For example, the mean value of the noise component is zero: $E[n_i]=0$.

In a fourth act 27 of the method 20, the noisy value is replaced by a noiseless value to obtain a clean image value for the pixel.

In the last act 29, the de-noising of the EM image according to the previous acts 21 to 27 is iterated for further patches of the EM image until the entire image is de-noised.

Figure 3:
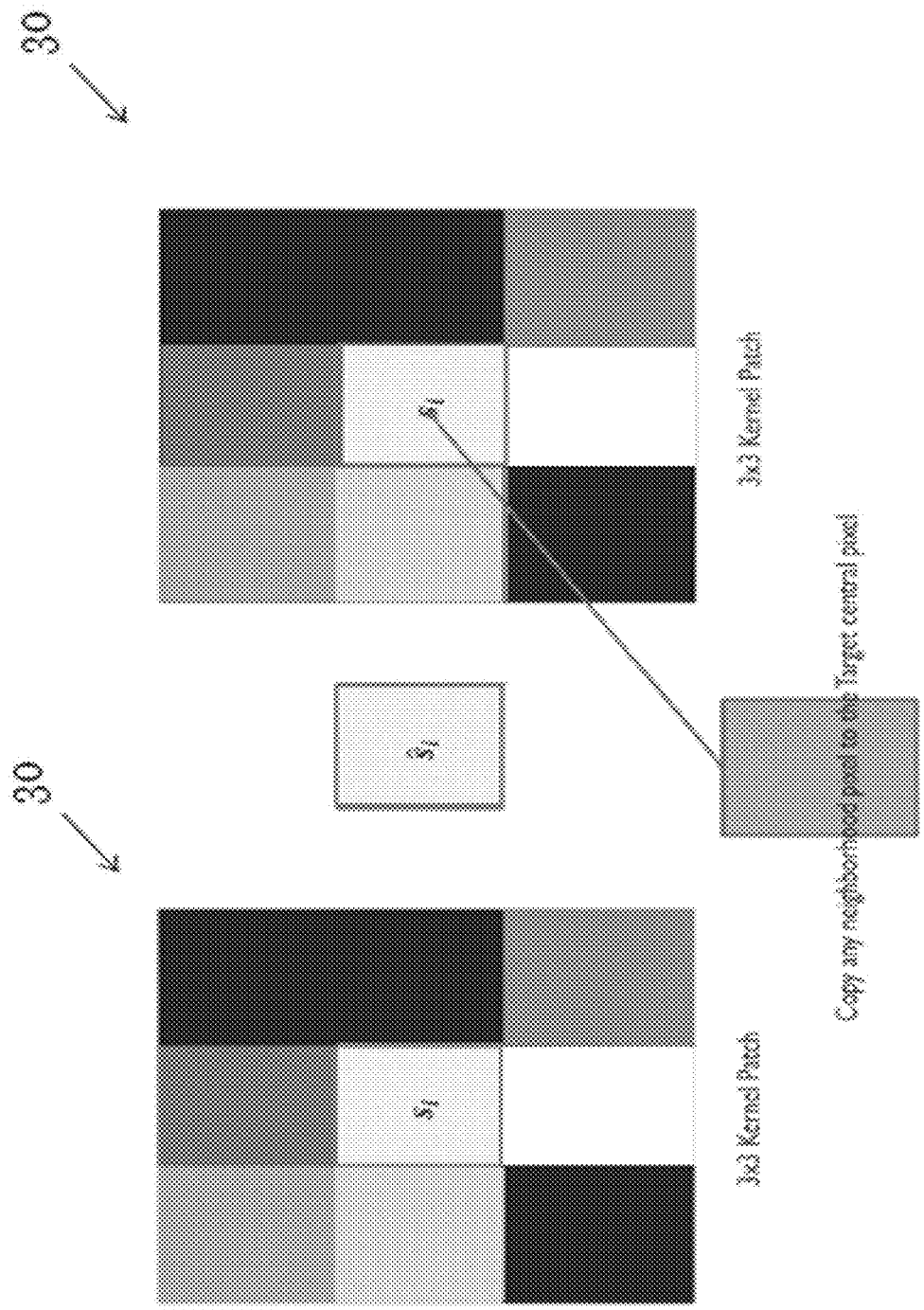
FIG. 3 is a schematic diagram of a section of a patch of an electron microscope image, according to an example.

FIG. 3 is a schematic diagram of a section 30 of a patch of the EM image according to an embodiment.

The section 30 shown in FIG. 3 is a 3×3 kernel within the patch.

The patch can have any size, depending on the model performance and/or the original image. For example, the patch could have a size of 32×32, 64×64, or 128×128 pixels.

For example, the left section 30 in FIG. 1 comprises noisy pixels, including a noisy center pixel $s_i$. When performing the de-noising method 10, the center pixel is replaced by a different, for example randomly selected, pixel from the same EM image. In this way, a patch section with a blind spot in the location of the center pixel can be generated (right patch section 30 in FIG. 3). Subsequently, a de-noised value for the blind spot can be determined based on the surrounding pixels.

The 3×3 kernel shown in FIG. 3 can be shifted in a step by step manner, e.g. by one pixel each time, over the patch. For each kernel position within the patch, a selected pixel of the patch is de-noised, e.g. the pixel in the center of the kernel.

Figure 4:
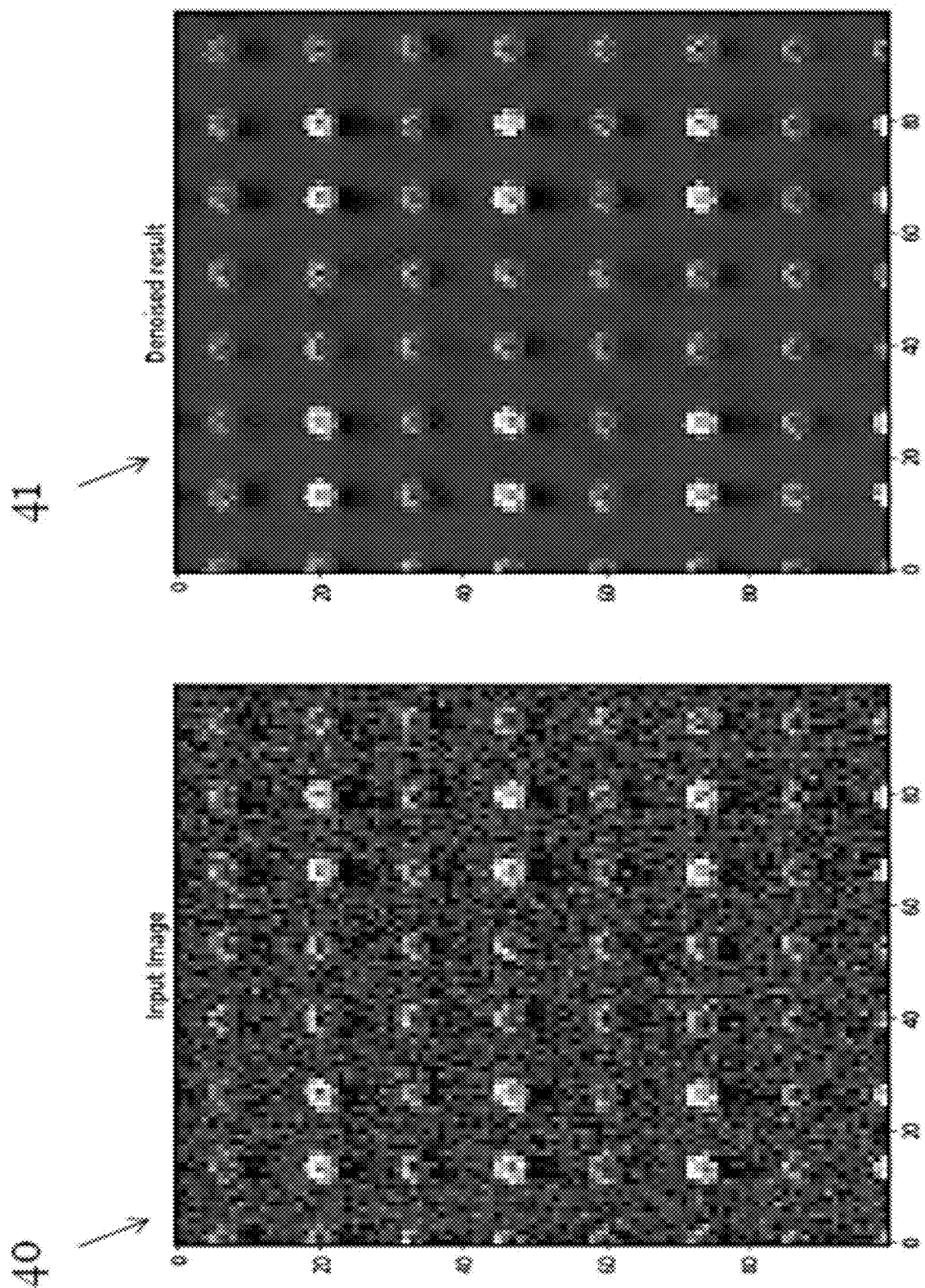
FIG. 4 shows a comparison of a noisy electron microscope image and a de-noised electron microscope image, according to an example.

FIG. 4 shows a comparison of a noisy EM image 40 and a de-noised EM image 41 according to an embodiment. For example, the de-noised EM image 41 was de-noised by any one of the de-noising methods 10 or 20 shown in FIG. 1 or FIG. 2.

For example, the image 40 is a SEM image that shows an array of memory structure, for example memory pillars, which are arranged on top of bottom electrodes on a substrate. Thereby, brightness differences between these structures in the SEM image can indicate different electrical properties of the pillars.

For example, the image was recorded in a voltage contrast (VC) mode of the SEM. Thereby, a positive voltage can be applied to the sample that is observed. For example, the brightness level of each structure in the images 40, 41 depends on the structure being shorted, i.e. set to ground, or open, i.e. electrically insulated. A structure that is shorted appears bright, wherein the brightness level depends on the conductivity of the structure. This conductivity analysis can be used to analyze various different memory structures. For instance, in phase change memories (PCM), the conductivity depends on the degree of crystallization of the memory structure, and in MRAM (magneto-resistive random-access memory), STT-MRAM (spin-transfer torque MRAM) or RRAM (resistive random-access memory) memories this conductivity, for instance, shows if the respective layers of the memories have aligned spins.

Generally, such VC SEM images are recorded in the context of defect inspection. During a typical inspection process, an optical or E-beam inspection is used to identify visible defects on a sample. These results can be compared with electrical inspection results. If the location of defects that were identified with both methods match, it indicates a pattern or process defect at this location. If a defect location does not match, a VC image can be recorded to identify non-visible defects.

For instance, the de-noised VC SEM images can be used to identify non-visible metal traces between the memory pillars. In addition, by analyzing the gray levels in the SEM images different resistance due to, e.g. thicker metal layers can be detected. While recording the EM image, the sample can be grounded physically, e.g. with wires, or placed on a wafer chuck and the wafer itself can be grounded.

Alternatively to such VC EM images, the de-noising method 10 can be applied to EM images that were recorded in a secondary emission (SE) mode or a back scattered electron (BSE) mode of an EM. The location of the section visible in the recoded EM image within the sample can be determined based on the known lithographic mask layout, as specified in a GDS file, an optical characterization measurement during an initial defect inspection, or an E-beam measurement during a SEM inspection.

Figure 5:
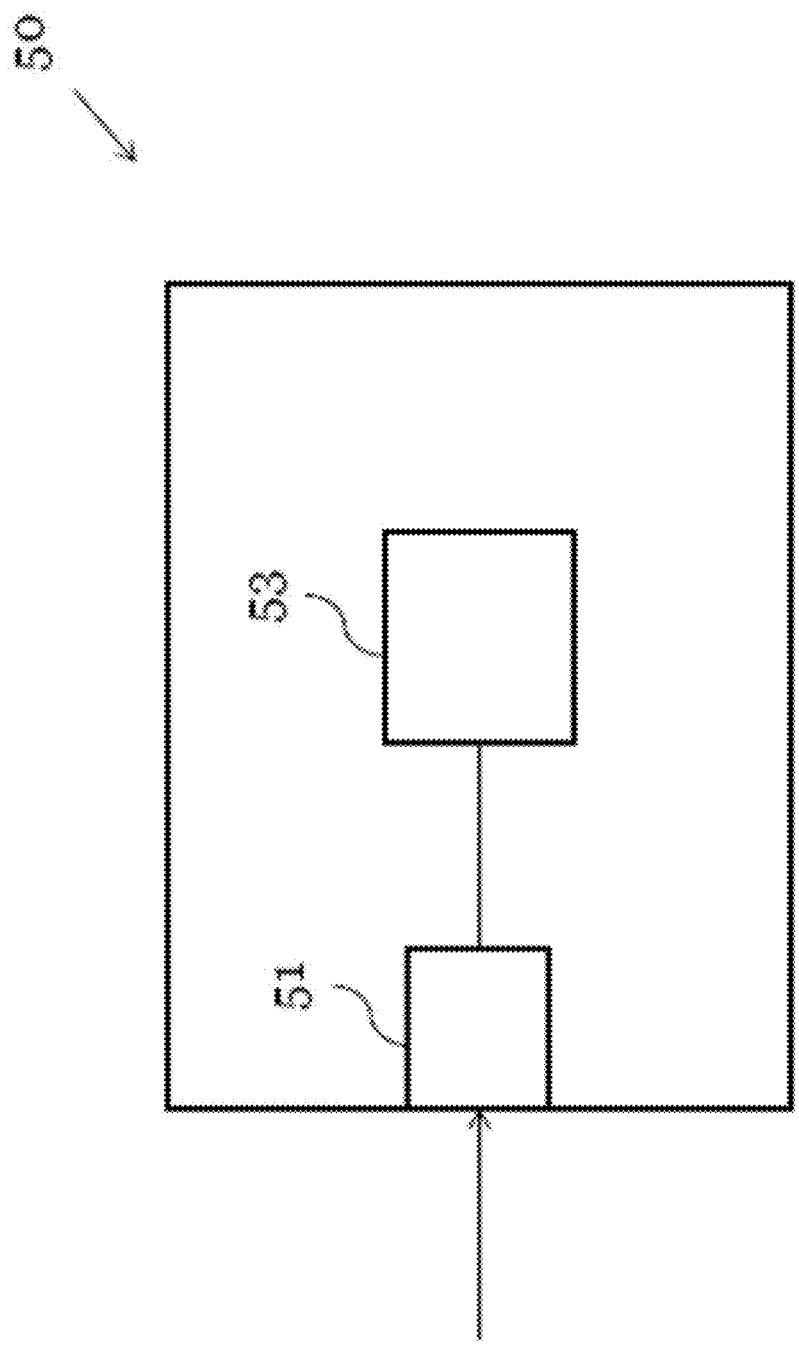
FIG. 5 is a schematic diagram of a device for de-noising an electron microscope image, according to an example.

FIG. 5 shows a schematic diagram of a device 50 for de-noising an electron microscope image according to an embodiment.

The device comprises a receiving unit 51 configured to receive an EM image; and a data processing unit 53 configured to perform the de-noising on the received EM image, for example according to the method 10 shown in FIG. 1.

The data processing unit 53 can comprise a processor and/or the trainable neural network for carrying out the de-noising method 10.

The receiving unit 51 can comprise an interface for receiving the EM image. For example, the receiving unit 51 can be directly connected to an EM tool for receiving the image. Alternatively, the receiving unit 51 can be connectible to a data storage in which the EM image is stored.

Figure 6:
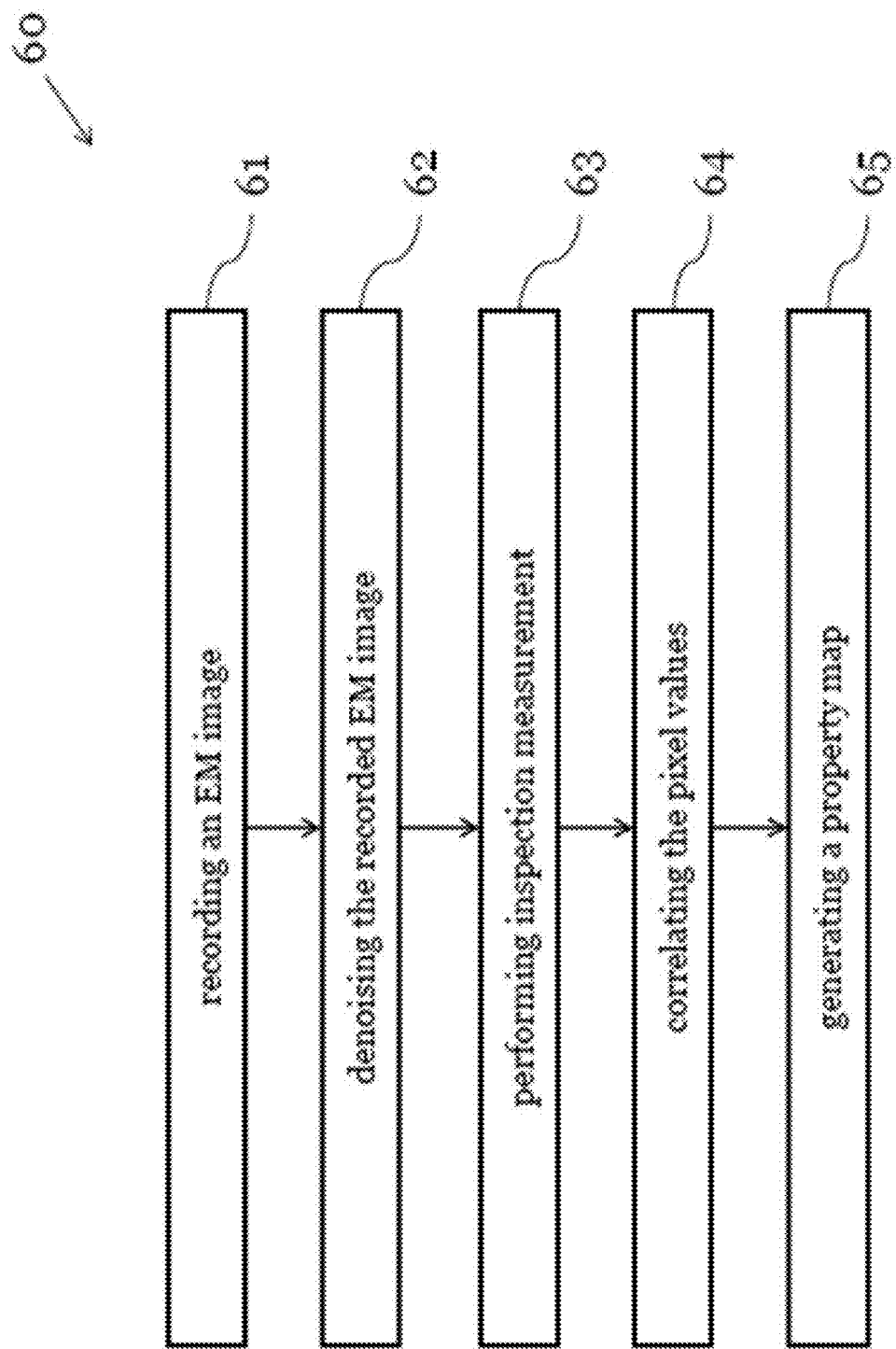
FIG. 6 is a block diagram of a method for analyzing a sample, according to an example.

FIG. 6 shows acts of a method 60 for analyzing a sample according to an embodiment.

The method 60 comprises the acts of: recording 61 an EM image of a section of the sample with a scanning electron microscope (SEM), wherein the EM image is recorded in a voltage contrast (VC) mode of the SEM; de-noising 62 the recorded EM image, for example, according to any one of the de-noising methods 10, 20 shown in FIG. 1 or FIG. 2. The method 60 further comprises the acts of: performing 63 a spatially resolved inspection measurement of the section of the sample, wherein the inspection measurement comprises determining electrical property values, for example conductivity values, at different locations of the section of the sample; correlating 64 the pixel values of the de-noised EM image to the electrical property values determined at the different locations of the section of the sample; and generating 65 a property map based the correlation, wherein the property map indicates the electrical properties of structures visible in the de-noised EM image.

The sample can be a die comprising memory structures, such as the structure visible in the SEM images in FIG. 4.

The de-noised EM image is used for further metrology applications (extracting Line-width-roughness/Line-edge-roughness, electrical properties, etc.). Other de-noising techniques may introduce artefacts in the de-noised images and, therefore, those de-noised images are not suitable for future device characterization acts or litho/metrology acts.

The act of performing 63 the spatially resolved inspection measurement can be carried out by an electrical probe station fitted with an impedance analyzer.

For example, the property map is a graphical representation of the section of the sample that was recorded in the VC SEM image and comprises additional graphical elements, e.g. a color coding, that indicate the electrical properties of different regions or structures visible in the map. For example, the graphical representation can be a simplified illustration of the sample that shows the outlines of structures that are visible in the VC SEM image.

For example, the property map can be a feature map, a proxy map or a variability map of the section of the sample.

In addition to the property map, a calibration curve can be generated based on the correlation between the pixel values of the EM image and the electrical property values. The calibration curve comprises, for instance, a correlation of gray scale values of a VC SEM image to respective electrical property values, e.g. resistance. Such a calibration curve can be used to generate property maps of further VC SEM images without performing an electrical inspection measurement each time.

Figure 7:
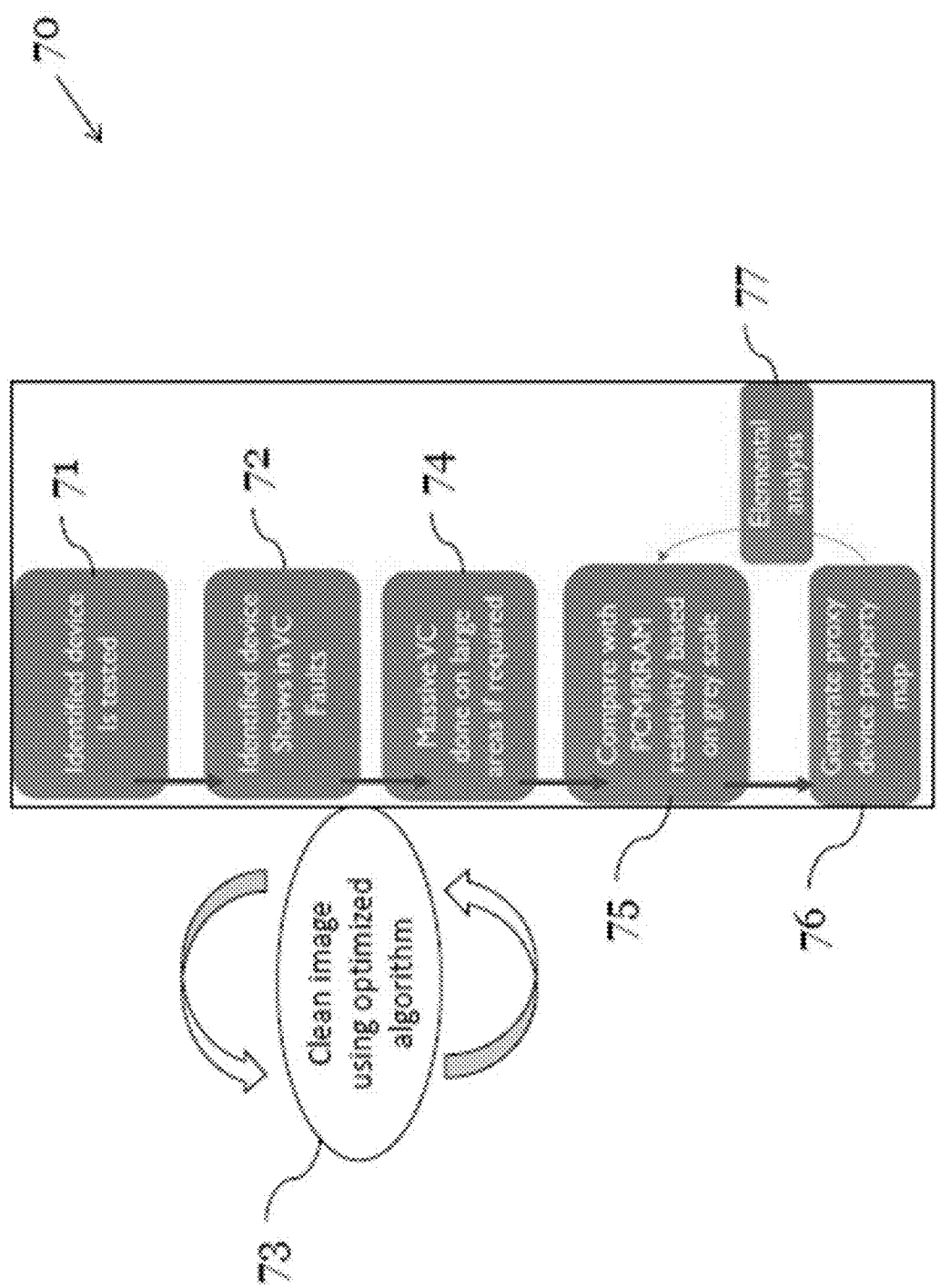
FIG. 7 is a block diagram of a method for analyzing a sample, according to an example.

FIG. 7 shows acts of a further method 70 for analyzing a sample according to an embodiment.

The method 70 comprises the acts of: testing 71 a device, such as a die comprising memory structures, for example PCM or RRAM structures, by recording an SEM image in a VC mode; and identifying 72 faults in the VC SEM image, e.g. unexpected conductivity values of the memory structures. Therefore, the VC SEM image can be de-noised 73 according to any one of the de-noising methods 10, 20 shown in FIG. 1 or FIG. 2.

If such faults are detected, the method 70 comprises the act of recording 74 multiple further VC images in large areas of the device, wherein each of these further VC images can be de-noised as well. In a further act 75, the de-noised VC SEM images are compared to known resistivity values of the memory structures. Thereby, the known resistivity values are matched to the gray scale values of the CV SEM image. The method 70 further comprises generating 76 a proxy device map, i.e. a property map, of the device based on the comparison 75. In another act 77, this proxy device map is used to analyze the electrical properties of the memory structures of the device.

Figure 8:
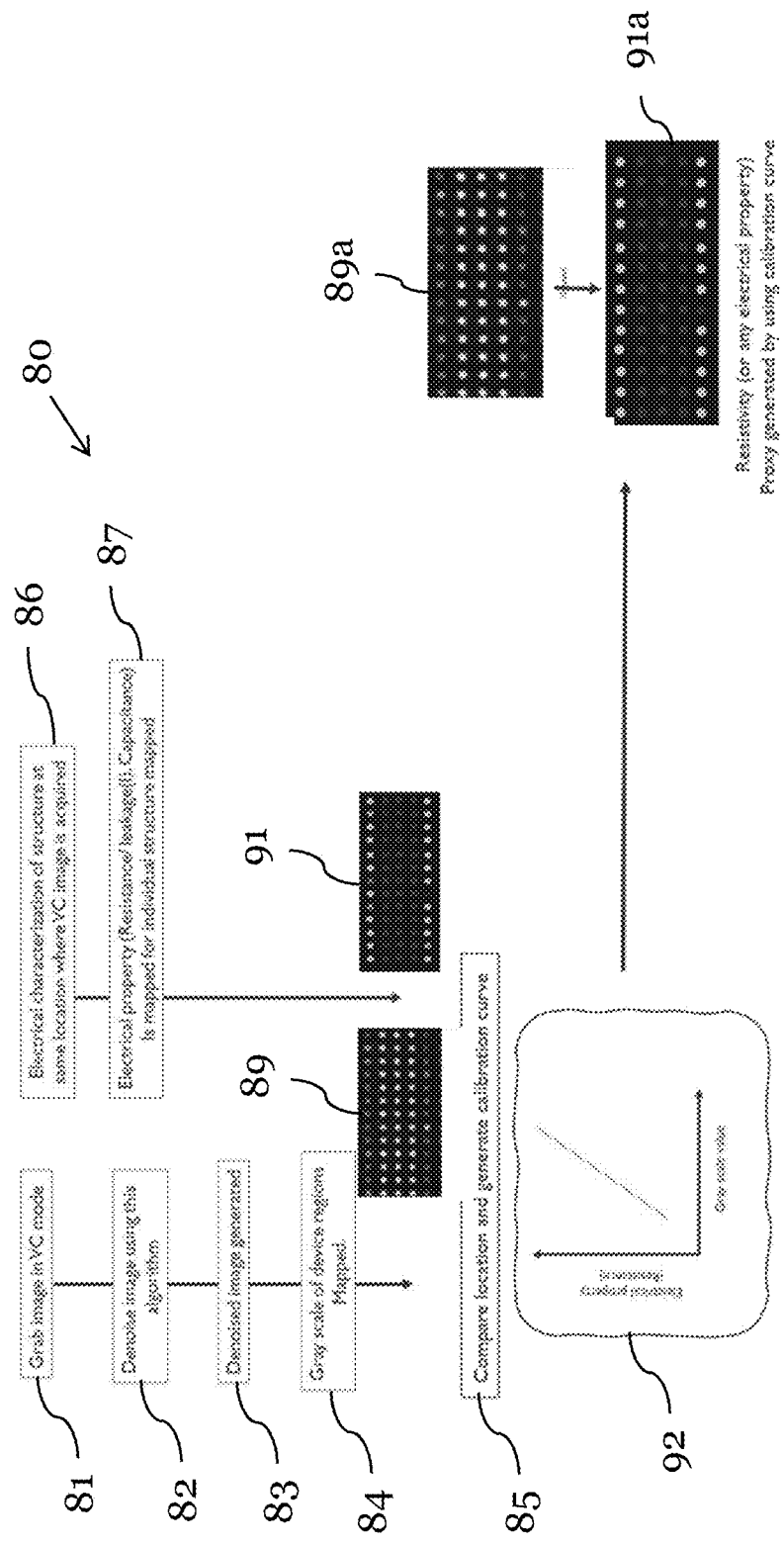
FIG. 8 is a block/schematic diagram of a method for analyzing a sample, according to an example.

FIG. 8 shows acts of the method 80 for analyzing the sample according to a further embodiment. For example, the method 80 shown in FIG. 8 comprises the acts of the method 60 shown in FIG. 6.

The method 80 comprises recording 81 an EM image of a section of a sample, wherein the EM image is recorded by a SEM in a VC mode; performing 82 a de-noising of the EM image, for example via the de-noising method 10 shown in FIG. 1, to generate 83 a de-noised image 89; and mapping 84 the generated image according to its gray level values, i.e. correlating the gray level values in the image to the respective locations of the sample.

Furthermore, the method 80 comprises performing 86 a spatially resolved electrical inspection measurement at the same location where the VC image was acquired, and mapping 87 the recorded electrical properties, e.g. resistance, leakage, or capacitance, i.e. correlating the recorded electrical properties to the respective locations of the sample. Subsequently, the property map 91 of the section of the sample can be generated, by correlating the gray scale values and the recorded electrical property values for the different locations on the sample.

In addition, the method 80 comprises generating 85 a calibration curve 92 based on the correlation of the pixel values, e.g. gray level values, of the VC SEM image and the recorded electrical property values. For example, the calibration curve 92 is generated in the form of a lookup table, which comprises a list of the electrical property values, e.g. resistivity values, for respective pixel values of an EM image, for example gray level values. This calibration curve 92 can be used to generate property maps for further VC SEM images without correlating these images to respective electrical property value measurement.

For instance, the method 80 may comprise the further act of: recording a further EM image 89a of a section of the same or a different sample with the SEM in VC mode, and generating a further property map 91a based on the further EM image and the calibration curve 92, wherein the further property map indicates the electrical property of structures visible in the further EM image 89a.

For example, by using the calibration curve 92 a time consuming manual mapping and calibration of VC SEM images and inspection measurements can be avoided. It would be tedious to correlate all possible grayscale values in a range from, e.g., 0 to 255 to a respective electrical property value.

For example, the calibration curve is generated by a trainable neural network, for example a multilayer perceptron (MLP) neural network. This neural network can further be configured to generate the property map 91 based on the de-noised VC SEM image 89 and the electrical inspection measurement and/or to generate the property map 91a based on the de-noised VC SEM image 89a and the calibration curve 92.

For example, a machine learning based algorithm can be used to learn the correlation between the degree of brightness/intensity/contrast of structures in the VC SEM image, e.g. memory pillars, and the corresponding electrical property, e.g. conductivity, values in terms of resistance/capacitance. This methodology makes it possible to flag small fluctuations in the voltage contrast level of the VC SEM image and to optimize the defect inspection of a sample.

Figure 9:
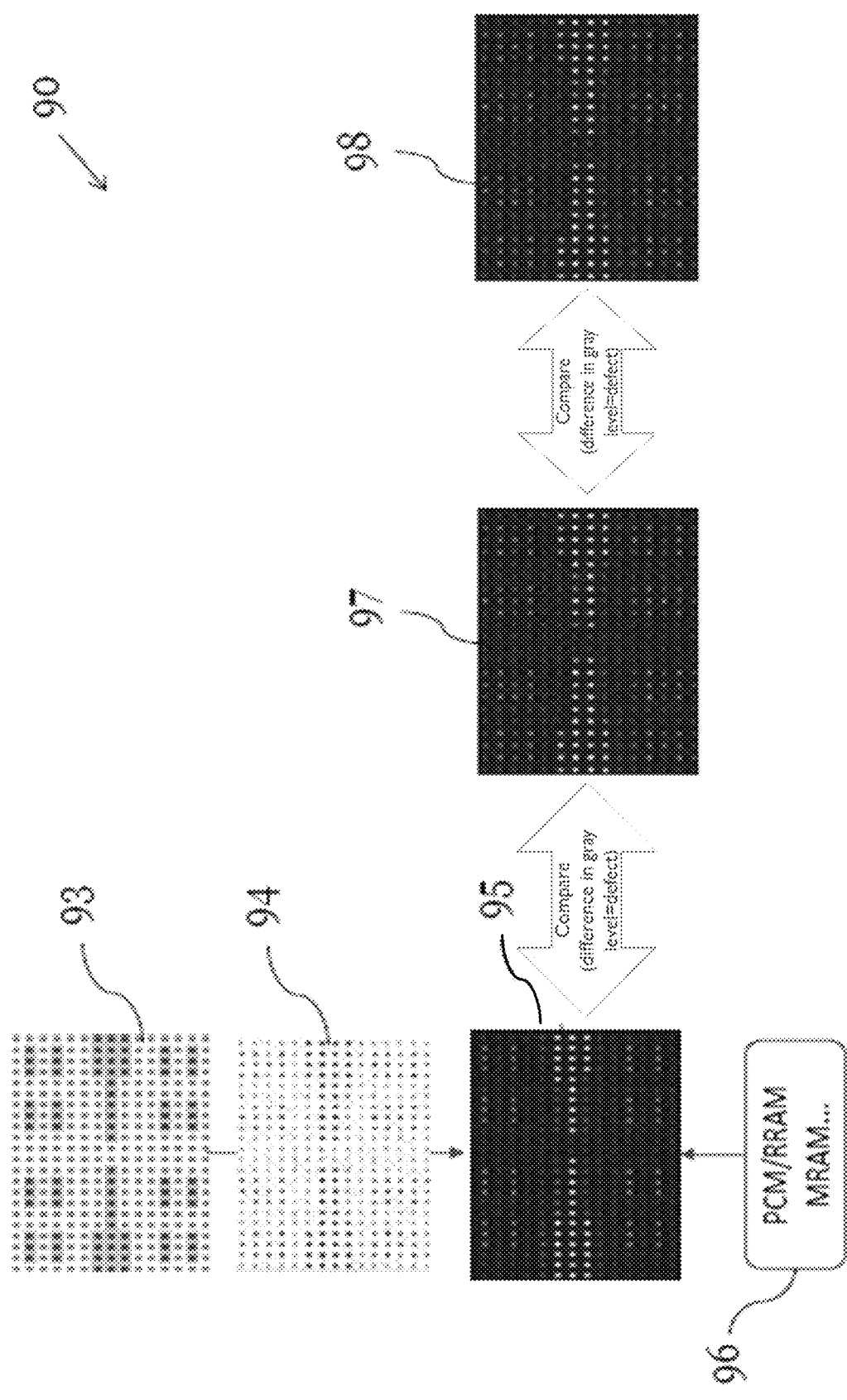
FIG. 9 is a block/schematic diagram of a method for analyzing a sample using a synthetic electron microscope image, according to an example.

FIG. 9 shows acts of a method 90 for analyzing a sample using a synthetic electron microscope image 95.

In this method 90 a known lithographic mask data 93, e.g. memory structures such as PCM, RRAM, or MRAM, is used to generate a synthetic image 94. Based on this synthetic image 94 and on expected electrical property information 96, e.g. information of the memory structures, the synthetic VC or CC EM image 95 can be generated.

This synthetic VC EM image 95 can be compared to a de-noised recorded VC SEM image 97 that was recorded with a SEM in VC mode. Thereby, the defects can be detected based on differences in gray levels in between the synthetic and the recorded image.

In addition or alternatively, the de-noised recorded VC SEM image 97 can be compared to another de-noised VC SEM image 98 from a different location of the sample or from a different sample with the same structures, e.g. another die from the same wafer. Again, defects can be detected based on differences in gray levels in between the two recorded de-noised images. Thereby, the de-noising of both images 97, 98 greatly enhances the accuracy of the detection of differences between the structures shown in both images 97, 98.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:
    recording an image of a section of a sample with a scanning electron microscope using a voltage contrast mode of the scanning electron microscope;
    replacing a first value of a first pixel of the image with a second value of a second pixel of the image;
    determining a de-noised value for the first pixel based on third values of third pixels of the image; and
    replacing the second value of the first pixel with the de-noised value to generate a denoised image;
    performing a spatially resolved inspection measurement of the section of the sample by determining electrical property values at different locations of the section of the sample;
    correlating pixel values of the denoised image to the electrical property values;
    generating a property map based on the correlating such that pixel values of the property map indicate the electrical property values of the different locations of the section of the sample; and
    determining a calibration curve based on the correlating, wherein the calibration curve correlates the pixel values of the image to the electrical property values.

2. The method of claim 1, wherein the first pixel is centered with respect to the third pixels.

3. The method of claim 1, further comprising randomly selecting the second value of the second pixel for replacing the first value of the first pixel.

4. The method of claim 1, further comprising determining a noise level of the image based on a difference between the first value and the de-noised value.

5. The method of claim 1, wherein the de-noised value is a first de-noised value, the method further comprising:
    replacing a fourth value of a fourth pixel of the image with a fifth value of a fifth pixel of the image;
    determining a second de-noised value for the fourth pixel based on sixth values of sixth pixels of the image; and
    replacing the fifth value of the fourth pixel with the second de-noised value.

6. The method of claim 5, wherein the fourth pixel is centered with respect to the sixth pixels.

7. The method of claim 5, further comprising determining a noise level of the image based on a first difference between the first value and the first de-noised value and a second difference between the fourth value and the second de-noised value.

8. The method of claim 5, wherein the third pixels and the sixth pixels are not mutually exclusive.

9. The method of claim 1, wherein determining the de-noised value comprises determining the de-noised value at least partially based on statistical dependencies between noiseless components of the third values.

10. The method of claim 1, wherein determining the de-noised value comprises determining the de-noised value via a trainable neural network.

11. The method of claim 10, wherein the trainable neural network is a U-Net based neural network.

12. The method of claim 10, wherein determining the de-noised value comprises training the trainable neural network via an unsupervised learning algorithm.

13. A device comprising:
    an interface configured to receive an EM image; and
    a processor configured to perform the method of claim 1.

14. The method of claim 1, further comprising:
    recording a further image of a second section of the sample or of a third section of a different sample with the scanning electron microscope operating in the voltage contrast mode; and
    generating a further property map based on the further image and the calibration curve, wherein the further property map indicates electrical properties of structures in the further image.

15. The method of claim 1, wherein determining the calibration curve comprises determining the calibration curve with a trainable neural network.

16. The method of claim 1, wherein the image is a first image, the method further comprising:
    generating a synthetic image of the section based on information on the sample;
    comparing the synthetic image to the image after de-noising; and
    identifying defects in the section based on the comparing.

17. The method of claim 1, wherein the sample is a die comprising memory structures.

18. The method of claim 1, wherein determining the electrical property values comprises determining conductivity values.

19. The method of claim 1, wherein determining the de-noised value comprises determining the de-noised value at least partially based on a statistical independence between noise components of the third values.

* * * * *